(12) United States Patent
Barnard et al.

(10) Patent No.: US 8,164,066 B2
(45) Date of Patent: Apr. 24, 2012

(54) MAGNETIC LENS, METHOD FOR FOCUSING CHARGED PARTICLES AND CHARGED PARTICLE ENERGY ANALYZER

(75) Inventors: Bryan Barnard, East Grinstead (GB); Christopher Glenister, East Grinstead (GB)

(73) Assignee: VG Systems Limited, Cambridge (GB)

( * ) Notice: Subject to any disclaimer, the term of this patent is extended or adjusted under 35 U.S.C. 154(b) by 95 days.

(21) Appl. No.: 12/837,857

(22) Filed: Jul. 16, 2010

(65) Prior Publication Data

US 2011/0012018 A1    Jan. 20, 2011

(30) Foreign Application Priority Data

Jul. 16, 2009   (GB) .................................. 0912332.4

(51) Int. Cl.
*H01J 37/145* (2006.01)
*H01J 37/14* (2006.01)
*G21K 5/10* (2006.01)

(52) U.S. Cl. ............ 250/396 ML; 250/396 R; 250/398; 250/310; 250/492.3; 313/359.1; 313/361.1

(58) Field of Classification Search ........... 250/396 ML, 250/396 R, 398, 310, 492.3; 313/359.1, 313/361.1
See application file for complete search history.

(56) References Cited

U.S. PATENT DOCUMENTS

| | | | |
|---|---|---|---|
| 6,555,824 B1 * | 4/2003 | Feuerbaum et al. | 250/396 R |
| 7,244,949 B2 * | 7/2007 | Knippelmeyer et al. | 250/396 ML |
| 7,385,205 B2 * | 6/2008 | Pearl | 250/491.1 |

* cited by examiner

*Primary Examiner* — Nikita Wells
(74) *Attorney, Agent, or Firm* — Charles B. Katz

(57) ABSTRACT

The invention provides a magnetic lens for generating a magnetic imaging field to focus charged particles emitted from a sample, the lens comprising a central pole piece and an outer pole piece disposed about the central pole piece, wherein the lens comprises a magnetic moveable element for movement relative to at least one of the pole pieces, whereby a focal length of the lens is variable by said movement of the magnetic moveable element, thereby enabling a zoom facility for changing the magnification of an image. The movement of the moveable element preferably changes the magnetic circuit between the pole pieces. Also provided is a method of focusing charged particles emitted from a sample and a charged particle energy analyzer, such as an imaging photoelectron spectroscopy system.

24 Claims, 11 Drawing Sheets

MAGNETIC LENS, METHOD FOR FOCUSING CHARGED PARTICLES AND CHARGED PARTICLE ENERGY ANALYZER

FIELD OF THE INVENTION

The present invention relates to magnetic lenses, methods for focusing charged particles, charged particle energy analyzers and improvements in and relating thereto.

BACKGROUND OF THE INVENTION

Magnetic lenses are widely used in the field of charged particle optics for focusing beams of charged particles, for example sub-atomic, atomic and polyatomic charged particles. The charged particles may be positively or negatively charged. Specific examples of charged particles for which magnetic lenses have been designed include ions, electrons, protons and other charged sub-atomic particles. Most commonly, magnetic lenses are used for focusing electrons.

It is known, for example, to use a magnetic lens to generate a charged particle image of a sample surface, such as an image of charged particles having a particular energy (which also means a particular range of energies) that have been ejected from the surface. If required, the image can be passed into an energy analyzer to produce an energy resolved image of the surface. The imaging field of the lens and the energy analyzer may be synchronously scanned to obtain an energy resolved image (e.g. a spectrum of particle energies for the image). From the energy resolved image it is possible to obtain information about the physical and chemical characteristics of a surface region of the sample.

Many different geometries of magnetic lens have been employed for different applications. One application of a magnetic lens is in photoelectron spectroscopy which is used to study the surface composition of a sample. In photoelectron spectroscopy, the sample is irradiated with electromagnetic radiation, typically from an X-ray or ultraviolet source, which causes electrons with energies of up to several thousand electron Volts (eV) to be emitted from the sample surface (so-called "photoelectrons"). The energies of the photoelectrons are characteristic of the elements and the chemical environment from which they were emitted. The two common forms of photoelectron spectroscopy are X-ray photoelectron spectroscopy (XPS) and ultraviolet photoelectron spectroscopy (UPS) where the names denote the type of radiation source used. The emitted photoelectrons are typically focused and separated according to their energy by an energy analyzer. The photoelectrons are then detected and a spectrum of photoelectron intensity against energy may be obtained, which can be used to yield information about the composition of the surface of the sample.

A magnetic lens may be used in XPS (in so-called imaging XPS) to focus photoelectrons emitted from a selected small area of the surface to thereby generate a photoelectron image of a sample surface. The photoelectron image is passed into an energy analyzer to produce an energy resolved image of the surface. Typically, the imaging field of the lens and the pass energy of the energy analyzer are synchronously scanned to create a spectrum of photoelectron energies for the image.

A conventional magnetic lens geometry for XPS is a so-called magnetic "snorkel" lens. The snorkel lens is mounted, in vacuum, below the sample as shown in FIG. 1A and described in more detail below. The snorkel lens geometry uses a central pole piece which extends into space from a surrounding annular pole piece or flux return. Such lenses are disclosed in EP 243 060 A, U.S. Pat. No. 5,286,974, U.S. Pat. No. 5,506,414, WO 99/53517 and JP 8-321272 A.

The advantage of a snorkel lens is that it allows good access to the sample from above (i.e. a clear line of sight), e.g. to facilitate surface processing and analysis, since the lens is completely positioned behind the sample. However, a snorkel lens has the drawback that the focal length of the lens is effectively fixed by its geometry so that little or no zoom of the magnification is possible. This therefore limits the ultimate resolution of the lens if it is also to be used for routine analysis with lower resolution. The fixed focal length of the lens also limits the thickness of a sample that can be used. In practice, some variation in the overall magnification of the XPS system can be achieved by varying the strength of subsequent lenses in the electron optical path but this fails to achieve the desired imaging resolution. In some applications, a much shorter focal length would be desirable, which leads to a smaller spherical aberration characteristic of the lens and a better imaging resolution.

In XPS applications, the snorkel lens is mounted inside an ultra high vacuum (UHV) chamber and so it is impractical to move or interchange lenses inside the vacuum chamber. Magnetic lens are also costly so that having several lenses would in any case add substantially to the cost of the system. A single snorkel lens could be designed with the shortest possible focal length but the working distance would then be so short that routine analysis would be severely hampered, e.g. for thicker samples, or where a large field of view is to be imaged.

Against the above background, the present invention has been made.

SUMMARY OF EMBODIMENTS OF THE INVENTION

According to an aspect of the present invention there is provided a magnetic lens for generating a magnetic imaging field to focus charged particles emitted from a sample, the lens comprising a central pole piece and an outer pole piece disposed about the central pole piece, wherein the lens comprises at least one magnetic moveable element for movement relative to at least one of the pole pieces, whereby a focal length of the lens is variable by said movement of the at least one magnetic moveable element.

According to another aspect of the present invention there is provided a use of the magnetic lens for focusing charged particles emitted from a sample.

According to still another aspect of the present invention there is provided a method of focusing charged particles emitted from a sample comprising:

providing a magnetic lens in proximity to the sample for generating a magnetic imaging field to focus the charged particles;

energizing the magnetic lens to generate the magnetic imaging field;

causing charged particles to be emitted from the sample; and focusing at least some of the charged particles emitted from the sample to produce a charged particle image of the sample;

wherein the magnetic lens is a magnetic lens according to the present invention.

According to a further aspect of the present invention there is provided a charged particle energy analyzer for analyzing a selected area of the surface region of a sample comprising: a sample holder; a source of radiation for causing the emission of charged particles from a sample placed on the sample holder; a magnetic lens for focusing at least some of the charged particles emitted from the sample; and analyzing means for analyzing the energy of the focused charged particles emitted from the sample, wherein the magnetic lens is a magnetic lens according to the present invention.

According to a still further aspect of the present invention there is provided a method of analyzing a selected area of a surface region of a sample comprising: providing a sample on a sample holder; irradiating a surface region of the sample with radiation thereby causing the emission of charged particles from the surface region; focusing at least some of the emitted charged particles using a magnetic lens; and analyzing the energy of the focused charged particles; wherein the magnetic lens is a magnetic lens according to the present invention.

The present invention beneficially provides a magnetic lens for focusing charged particles emitted from a sample, especially a lens suitable for imaging photoelectron spectroscopy, which has an adjustable focal length and hence adjustable resolution. This is in contrast to the prior art magnetic lenses which have a fixed focal length. The invention achieves this advantage by moving the moveable element of the lens so as to change the magnification of the lens and provide a "zoom" facility. The zoom (or change in magnification) between the two or more positions of the magnetic lens can be, for example, a factor of 6× (6 times) or more. For example, the magnification may be changed from 6× to 40×. Moreover, the invention provides a magnetic lens for focusing charged particles that can be operated in vacuum to provide a zoom facility with much less restriction on sample thickness for routine analysis compared to the prior art.

DETAILED DESCRIPTION OF THE INVENTION

Figure 1A:
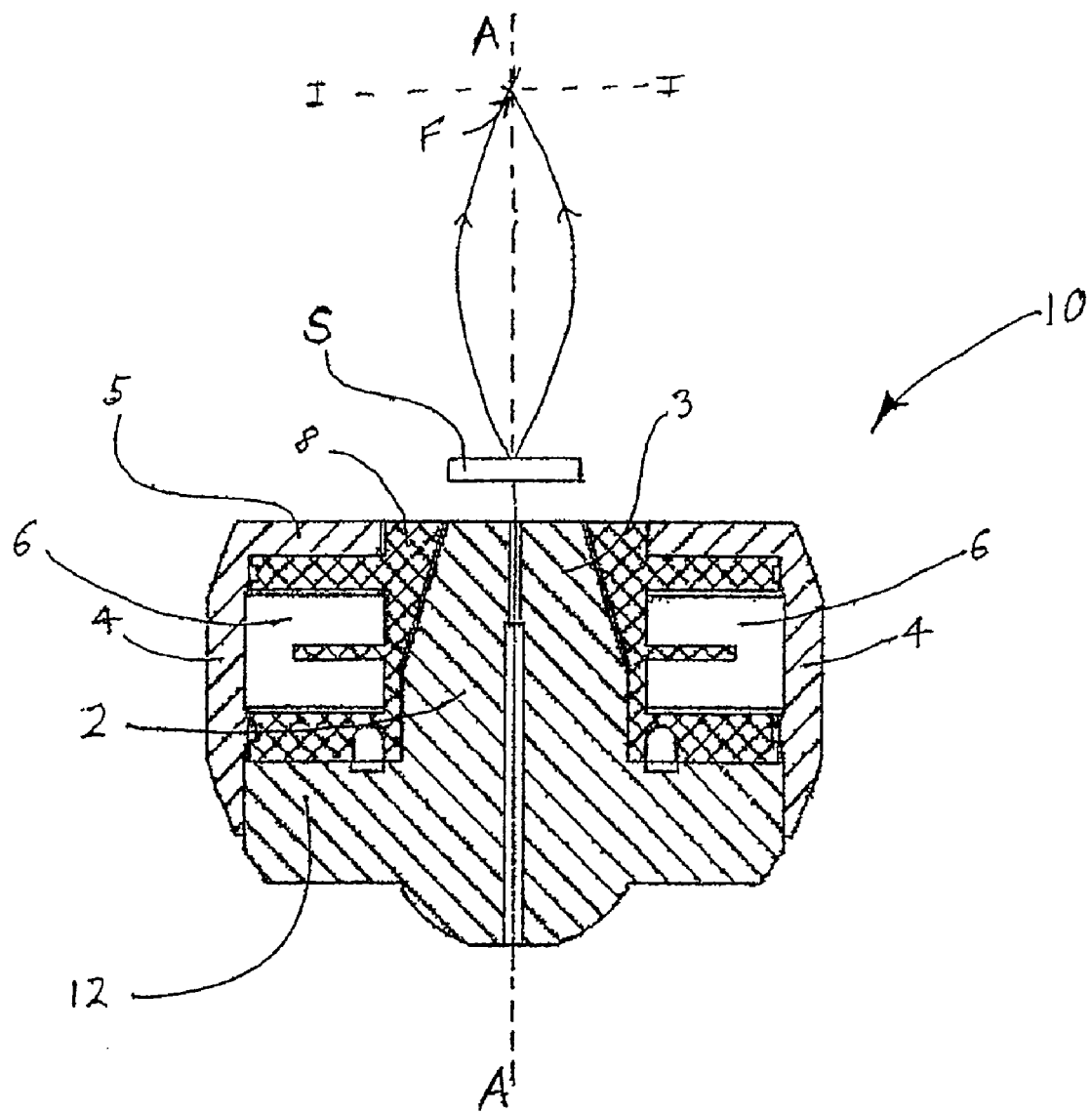
FIG. 1A shows schematically a cross-sectional side view of a snorkel lens according to a conventional design.

The sample may be any sample emitting charged particles. Preferably, the magnetic lens of the invention is for focusing charged particles from a selected area of the surface region of a sample, e.g. a solid sample. The magnetic lens is preferably for generating a magnetic imaging field to focus photoelectrons emitted from a sample. The magnetic lens is preferably a magnetic lens for use in a photoelectron spectroscopy, e.g. for imaging the photoelectrons emitted from the surface of a sample, preferably in combination with an electron energy analyzer to analyse the energy of the imaged photoelectrons. The photoelectron spectroscopy is preferably X-ray photoelectron spectroscopy (XPS) or ultraviolet photoelectron spectroscopy (UPS), more preferably XPS.

The magnetic lens is preferably, though not necessarily, for operation in a reduced pressure environment, i.e. a vacuum, typically a high or ultra high vacuum (UHV).

Either the central pole piece or the outer pole piece, or both pole pieces may comprise a magnetic moveable element of the lens. In other words, in preferred embodiments, either or both of the central pole piece and the outer pole piece may comprise or be a magnetic moveable element as described, which is moveable relative to the other pole piece. The lens preferably comprises either of or both of a central magnetic moveable element, which preferably is comprised in the central pole piece, and an outer magnetic moveable element, which preferably is comprised in the outer pole piece. For example, the moveable element may be the central pole piece and/or the outer pole piece. In such embodiments, the movement of at least one of the pole pieces relative to the other causes a change in the magnetic circuit between the pole pieces, i.e. a change in the magnetic flux density which results in a change in the magnetic imaging field and the lens focal length. Reference to the lens comprising a moveable element herein means the lens comprising at least one moveable element. For example, the lens may comprise two or more moveable elements, in which case both of the central pole piece and the outer pole piece may each comprise or be a moveable element in some embodiments.

The focal length of the lens is variable by moving a moveable element of the lens. The focal length of the lens is preferably variable by movement of a moveable element between at least a first position and a second position. The terms first position and second position merely denote two respective positions in space and do not denote any particular order in time. Additionally, the moveable element may be moveable between further positions, e.g. third position etc.

Preferably, at least one moveable element, by movement relative to at least one, preferably both, of the pole pieces, changes the magnetic circuit between the pole pieces. Preferably, where a moveable element is one of the pole pieces, the moveable element, by movement relative to the other of the pole pieces, changes the magnetic circuit between the pole pieces. The moveable element preferably comprises a magnetic part which, by movement relative to at least one, preferably both, of the pole pieces, changes the magnetic circuit between the pole pieces.

In certain embodiments, at least one magnetic moveable element, preferably a central moveable element e.g. which forms the central pole piece, preferably comprises a magnetic part which, in a first position, forms part of the central pole piece in the magnetic circuit and, in a second position, forms part of the outer pole piece in the magnetic circuit, e.g. thereby decreasing the effective diameter of the inner pole piece in the magnetic circuit. In this way, in the first position of the central moveable element, a first magnetic circuit may be generated between the pole pieces and in the second position of the central moveable element a second magnetic circuit may be generated between the pole pieces, different from the first magnetic circuit. The second position of the central moveable element is a zoom-in magnification position of the lens relative to the first position of the central moveable element. The first position of the central moveable element is retracted with respect to the lens and the second position of the central moveable element is extended with respect to the lens.

In certain embodiments, at least one magnetic moveable element, preferably an outer moveable element e.g. which forms the outer pole piece, preferably comprises a magnetic part which, in a first position, forms part of the outer pole piece in the magnetic circuit and, in a second position, forms part of the inner pole piece in the magnetic circuit, e.g. thereby increasing the effective diameter of the inner pole piece in the magnetic circuit. In this way, in the first position of the outer moveable element, a first magnetic circuit may be generated between the pole pieces and in the second position of the outer moveable element a second magnetic circuit may be generated between the pole pieces, different from the first magnetic circuit. The second position of the outer moveable element is a zoom-out magnification position of the lens relative to the first position of the outer moveable element. The first position of the outer moveable element is extended with respect to the lens and the second position of the central moveable element is retracted with respect to the lens.

By using both a central magnetic moveable element and an outer magnetic moveable element in the lens as described above, it is possible to provide the lens with both a zoom-in and zoom-out magnification as well as a normal magnification, thus providing three different magnification settings. By using one of a central magnetic moveable element and an outer magnetic moveable element in the lens two different magnification settings may be provided: either normal and zoom-in or normal and zoom-out.

In certain preferred embodiments, the moveable element, preferably a central moveable element comprises a first magnetic part and a second magnetic part. The second magnetic part is preferably the part which, in a first position, forms a part of the central pole piece and, in a second position forms, a part of the outer pole piece. Still more preferably, the first magnetic part and the second magnetic part are separated by a non-magnetic part, especially where each magnetic part is connected to the non-magnetic part which is disposed between them.

Preferably, in the first position the first and second magnetic parts of a central moveable element form part of the central pole piece thereby defining a first focal length of the lens. Preferably, in the second position, the first magnetic part of the moveable element forms part of the central pole piece and the second magnetic part of the moveable element forms part of the outer pole piece, thereby defining a second focal length of the lens, i.e. different to the first focal length.

In certain preferred embodiments, the moveable element, preferably an outer moveable element comprises a first magnetic part and a second magnetic part. The second magnetic part is preferably the part which, in a first position, forms a part of the outer pole piece and, in a second position forms, a part of the central pole piece. Still more preferably, the first magnetic part and the second magnetic part are separated by a non-magnetic part.

Herein, any components of the lens referred to as magnetic need not comprise permanently magnetic material but may be magnetisable e.g. upon energisation. That is, magnetic herein means permanently magnetic or magnetisable. With regard to the choice of magnetic materials for the various magnetic components of the present invention, the magnetic material would be selected depending on the maximum magnetic flux density that is required in this component. For example, where the magnetic flux density is less than or about 0.6 Tesla a high permeability magnetic material such as a Nickel Iron alloy would be a preferred choice (e.g. as available under trade names such as Mu-Metal™ or Supermalloy™). If the magnetic flux exceeds this value but does not exceed about 1.6 Tesla a material such as high purity iron would be a preferred choice (e.g. as available under trade names such as Maximag™). If a magnetic flux density above 1.6 Tesla is required a high saturation magnetic material such as a Cobalt alloy would be a preferred choice (e.g. as available under trade names such as Permendur™ or HiperCo™).

The central pole piece and outer pole piece are each a magnetic pole piece of the lens. In use, a magnetic field or circuit is generated between the pole pieces. The central pole piece and outer pole piece each have ends which are closest to the sample, i.e. facing toward the sample, which help define the characteristics of the imaging magnetic field (including the lens focal length). These sample facing ends are spaced apart from each other. In this context, spaced apart includes spaced apart with vacuum therebetween (e.g. as in embodiments of the first position of a moveable element of the lens) or spaced apart having a non-magnetic part therebetween (e.g. as in embodiments of the second position of a moveable element of the lens where the first magnetic part of the moveable element forms part of the central pole piece and the second magnetic part forms part of the outer pole piece and the two parts are spaced apart by the non-magnetic part of the moveable element).

The axis of the magnetic imaging field is preferably co-axial with the axis of the lens. The axis of the magnetic imaging field preferably runs through the central pole piece, i.e. through the centre thereof. The axis of the lens accordingly preferably runs through the central pole piece. The magnetic imaging field is preferably substantially symmetrical about the central pole piece. Small deviations from the symmetry of the imaging field do not affect focusing and can be compensated for by other optics in the system.

The central pole piece is preferably located on the axis of the lens and preferably on the axis of the magnetic imaging field.

The central pole piece is preferably circular in transverse cross section, i.e. the cross section in a plane perpendicular to the axis of the imaging field. This helps the magnetic field to be substantially symmetrical about the central pole piece. More preferably, the central pole piece and outer pole piece are both circular in transverse cross section.

Preferably, the central pole piece is co-axial with the outer pole piece. The central pole piece and the outer pole piece are preferably symmetrical about the lens axis.

Particularly preferably, the central pole piece and outer pole piece are both circular in transverse cross section and co-axially aligned.

Preferably, the central pole piece comprises a body, the central moveable element being arranged for movement relative to the body of the central pole piece. The body comprises a magnetic material.

Preferably, the central moveable element is moveable between at least a first position and a second position. In the first position, preferably the moveable element is positioned whereby the first and second magnetic parts of the moveable element form at least part of (optionally the whole of) the central pole piece thereby defining a first focal length of the lens. In the second position, preferably the central moveable element is positioned whereby the first magnetic part of the moveable element forms at least part of (optionally the whole of) the central pole piece and the second magnetic part of the moveable element forms part of the outer pole piece, thereby defining a second focal length of the lens (zoom-in).

More preferably, the central moveable element is moveable between at least a first position and a second position with respect to the body of the central pole piece and hence with respect to the lens itself. In the first position, preferably the moveable element is retracted with respect to the body of the central pole piece and hence with respect to the lens itself whereby, in preferred embodiments, the first and second magnetic parts of the moveable element are in connection with the body of the central pole piece such that the first and second magnetic parts form part of the central pole piece thereby defining a first focal length of the lens. In the second position, preferably the moveable element is extended with respect to the body of the central pole piece and hence with respect to the lens itself whereby the first magnetic part of the moveable element is in connection with the body of the central pole piece such that the first magnetic part forms part of the central pole piece and the second magnetic part of the moveable element is in connection with the outer pole piece such that the second magnetic part forms part of the outer pole piece, thereby defining a second focal length of the lens.

The outer pole piece is preferably annularly disposed about the central pole piece. In such embodiments, the space defined between the outer pole piece and the central pole piece is an annular space, more preferably a circular annular space to provide a more symmetrical imaging field.

The outer pole piece is more preferably annularly continuous about the central pole piece (i.e. forming a complete ring about the central pole piece) but may be annularly discontinuous (i.e. having one or breaks in a ring about the central pole piece).

The outer pole piece is preferably circular in transverse cross section, i.e. cross section in a plane perpendicular to the axis of the imaging field.

The outer pole piece is preferably co-axial with the central pole piece.

The outer pole piece, preferably where the outer pole piece is not moveable, is preferably connected to the central pole piece, more preferably to the body of the central pole piece. Still more preferably, the outer pole piece is connected to the body of the central pole piece by a base piece. Most preferably the base piece is integral with one or both of the outer pole piece and body of the central pole piece (i.e. in the case where the base piece is integral with both of the outer pole piece and body of the central pole piece they constitute a single piece).

The outer pole piece has a sample facing end, nearest the sample. The sample facing end preferably is annular. The sample facing end preferably extends inward toward the central pole piece. The inwardly extending sample facing end preferably has a surface facing the central pole piece. Preferably, the inwardly extending sample facing end of the outer pole piece has an internal diameter which decreases in the direction of the sample, e.g. the inner surface of the inwardly extending end facing the central pole piece may have a conical profile as described in more detail below. The choice of material for the outer pole piece will depend upon the expected magnetic flux density in the pole piece as described above.

In certain preferred embodiments, e.g. where a zoom-out facility of the lens is required, the outer pole piece comprises or is a magnetic moveable element, i.e. an outer magnetic moveable element. The outer moveable element preferably comprises a sample facing end, nearest the sample, which sample facing end preferably is annular, which is a first magnetic part of the moveable element. The sample facing end preferably is annularly disposed about the central pole piece The sample facing end preferably extends inward toward the central pole piece The radially outer-most part of the outer moveable element is preferably a second magnetic part, which is connected to the first magnetic part (i.e. the sample facing end) by a non-magnetic part, i.e. the first and second magnetic part are separated by the non-magnetic part.

Preferably, the outer moveable element is moveable between at least a first position and a second position. In the first position, preferably the outer moveable element is positioned whereby the first and second magnetic parts of the outer moveable element form the outer pole piece thereby defining a first focal length of the lens. In the second position, preferably the outer moveable element is positioned whereby the first magnetic part of the outer moveable element forms at least part of the central pole piece and the second magnetic part of the moveable element forms the outer pole piece, thereby defining another focal length of the lens (zoom-out position).

The lens preferably comprises an energizing means disposed in the space between the central pole piece and outer pole piece to energise the lens and generate the imaging magnetic field. The energizing means for the lens is preferably a coil. The energizing means, e.g. coil, is preferably annularly disposed in the space between the central pole piece and outer pole piece, i.e. annularly about the central pole piece. The energizing coil is preferably energised with DC current resulting in a unidirectional magnetic field.

In view of the above, therefore, in certain preferred embodiments, the magnetic lens of the invention comprises:
a central pole piece;
an outer pole piece disposed about the central pole piece and defining a space therebetween;
an energizing means disposed in the space between the central pole piece and outer pole piece; and
a central moveable element of the central pole piece having a first magnetic part and a second magnetic part, said first and second magnetic parts being separated by a non-magnetic part;
wherein the central pole piece comprises a body; and
wherein a focal length of the lens is variable to a first extent by movement of the central moveable element relative to the body of the central pole piece between at least a first position and a second position;
wherein in the first position the central moveable element is retracted with respect to the body of the central pole piece whereby the first and second magnetic parts of the moveable element are in connection with the body of the central pole piece such that the first and second magnetic parts form part of the central pole piece thereby defining a first focal length of the lens; and
wherein in the second position the central moveable element is extended with respect to the body of the central pole piece whereby the first magnetic part of the moveable element is in connection with the body of the central pole piece such that the first magnetic part forms part of the central pole piece and the second magnetic part of the moveable element is in connection with the outer pole piece such that the second magnetic part forms part of the outer pole piece, thereby defining a second focal length of the lens different to the first focal length.

More preferably still, in the above preferred embodiments the outer pole piece comprises an outer magnetic moveable element wherein the outer magnetic moveable element also comprises a first magnetic part and a second magnetic part which are connected by a non-magnetic part; wherein the focal length of the lens is variable to a second extent, different to the first extent, by movement of the outer moveable element relative to the central pole piece between at least a first position and a second position.

When each of the central moveable element and outer moveable element are in their first positions, a normal magnification is provided by the lens; when the central moveable element is in its second position and the outer moveable element is in its first position, a zoom-in magnification is provided by the lens; and when the central moveable element is in its first position and the outer moveable element is in its second position, a zoom-out magnification is provided by the lens.

Preferably, the body of the central pole piece is circular in transverse cross section. Preferably, the body of the central pole piece has a through-bore. The through-bore is preferably circular in transverse cross section. The through-bore preferably is for accommodating therein the moveable element. The choice of material for the body of the central pole piece will depend upon the expected magnetic flux density in the body as described above.

The moveable element is preferably slidably disposed in the body of the central pole piece.

The moveable element is preferably circular in transverse cross section to fit in a through-bore of the body of the central pole piece which is also preferably circular in transverse cross section. The moveable element preferably has an end nearest the sample, which is a sample facing end.

The moveable element may be moved by any suitable means. For example, the movable element may be actuated either by an in-vacuum pneumatic device (e.g. bellows actuator) or a vacuum electrical device (e.g. in-vacuum stepper motor). Alternatively, the moveable element may be actuated from a similar device situated outside the vacuum chamber and connected to the moveable element through the vacuum wall by a system of levers or other mechanical actuator mechanism.

The invention may have more than one moveable element so as to give a wider range of focal lengths. Thus, references herein, including in the claims, to a moveable element do not restrict the invention to one moveable element but rather the lens may comprise a plurality of moveable elements.

In preferred embodiments, the moveable element comprises first and second magnetic parts as described in more detail below.

The first magnetic part of a central moveable element preferably comprises a magnetic elongate member. The magnetic elongate member preferably is accommodated in a through-bore of the body of the central pole piece and in connection therewith. The magnetic elongate member is preferably circular in transverse cross section, more preferably slidably disposed in a circular through-bore of the body of the central pole piece.

The first magnetic part of a central moveable element, in use, is preferably in connection with the body of the central pole piece in all positions of the moveable element, so that it always forms part of the central pole piece.

The first magnetic part preferably has an end nearest the sample, which is herein termed a sample facing end. Preferably, the sample facing end of the first magnetic part has an external diameter which decreases in the direction of the sample, e.g. the sample facing end of the first magnetic part has an outer surface with a conical profile as described in more detail below.

The choice of material for the first magnetic part will depend upon the expected magnetic flux density in the part as described above.

The second magnetic part of a central moveable element is preferably in connection with the body of the central pole piece in the first position so that it forms part of the central pole piece but is preferably in connection with the outer pole piece in the second position so that it forms part of the outer pole piece.

The second magnetic part of a central moveable element preferably has an end nearest the sample, herein termed a sample facing end. The second magnetic part preferably is disposed about the sample facing end of the first magnetic part.

The second magnetic part of a central moveable element preferably comprises a magnetic annular member, more preferably a magnetic annular member circular in transverse cross section. The magnetic annular member preferably is disposed about the first magnetic part. The magnetic annular member more preferably is disposed about the sample facing end of the first magnetic part. The magnetic annular member is spaced from the sample facing end of the first magnetic part by the non-magnetic part.

Preferably, for use when the central moveable element is in the second position, the second magnetic part has an outer surface profiled for engagement with a complementarily profiled inner surface of the outer pole piece. More preferably, the second magnetic part comprises a magnetic annular member as described above which has an outer surface profiled for engagement with a complementarily profiled inner surface of the outer pole piece, i.e. a surface thereof which faces the central pole piece (e.g. the surface of the inward extending sample facing end of the outer pole piece). In a preferred embodiment, the magnetic annular member has an external diameter which decreases in the direction of the sample, e.g. the magnetic annular member has an outer surface with a conical profile, which tapers in the direction of the sample. In this preferred embodiment, the outer pole piece preferably has a sample facing end which extends inward toward the central pole piece and which has an inner surface facing the central pole piece, the surface having a corresponding conical profile, such that, in the second position, the conically profiled outer surface of the magnetic annular member may engage with the conically profiled inner surface of the outer pole piece. To ensure sufficient engagement therewith in the second position, the second magnetic part, e.g. the magnetic annular member, preferably has a maximum external diameter (i.e. its largest external diameter) which is greater than the minimum internal diameter (i.e. its smallest internal diameter) of the outer pole piece, especially of the sample facing end of the outer pole piece.

In order to obtain reproducibility and good concentricity between the two, preferably the magnetic annular member has an inner surface with a profile corresponding to a profile of an outer surface of the first magnetic part, especially the sample facing end thereof, about which the magnetic annular member is disposed. In such configurations the inner surface of the magnetic annular member is substantially parallel with an outer surface of the first magnetic part at least along a portion of the first magnetic part about which it is disposed. In a preferred embodiment, the magnetic annular member has an internal diameter which decreases in the direction of the sample, e.g. the magnetic annular member has an inner surface with a conical profile, which tapers in the direction of the sample. In this preferred embodiment, the first magnetic part has an outer surface, especially at its sample facing end, also with a conical profile.

The choice of material for the second magnetic part will depend upon the expected magnetic flux density in the part as described above.

The non-magnetic part of the moveable element separating the first and second magnetic parts may comprise a solid material (e.g. a non-magnetic metallic or plastics material, especially a vacuum compatible non-magnetic metal or plastics material) and/or a space (e.g. air or vacuum), preferably a solid material. The non-magnetic part is preferably made of a vacuum compatible non-magnetic material such as, for example, copper, phosphor bronze or stainless steel. The non-magnetic part preferably comprises a non-magnetic annular member, more preferably a non-magnetic annular member circular in transverse cross section, e.g. to fit between first and second magnetic parts also of circular transverse cross section as described above, e.g. to co-axially align the first and second magnetic parts and act as a spacing element therebetween.

In the first (i.e. retracted) position of a central moveable element preferably the first magnetic part and second magnetic part are each in connection (i.e. contact) with the body of the central pole piece such that they each form part of the central pole piece thereby defining a first focal length of the lens. Preferably, in the first position, the central pole piece does not extend out of the lens beyond the outer pole piece, i.e. the body of the central pole piece and the moveable element together do not extend beyond the outer pole piece. More preferably, in the first position, the sample facing ends of the first and second magnetic parts are substantially flush with the sample facing end of the outer pole piece, i.e. such that the central pole piece does not extend out of the lens beyond the outer pole piece. In the first position, the magnetic flux return path between the pole pieces, and thus the imaging field and first focal length, depends in part on the distance between the sample facing ends of the second magnetic part and the outer pole piece.

In the second (i.e. extended) position of a central moveable element preferably the first magnetic part of the moveable element is in connection with the body of the central pole piece such that the first magnetic part forms part of the central pole piece and the second magnetic part of the moveable element is in connection with the outer pole piece such that the second magnetic part forms part of the outer pole piece, thereby defining a second focal length of the lens. Preferably, in the second position, the central pole piece extends out of the lens beyond the outer pole piece. Preferably, in the second position the sample facing ends of the first and second magnetic parts are extended beyond the sample facing end of the outer pole piece in the direction of the sample.

In certain preferred embodiments, in the second position of a central moveable element, the lens works with a smaller effective diameter central pole piece, which diameter is constituted by the first magnetic part of the moveable element, and a typically shorter flux return path (dependent on the distance between the first and second magnetic parts) resulting in a typically shorter working distance and increased magnification. In the second position, the magnetic flux return path, and thus imaging field and second focal length, depends on the distance between the sample facing ends of the first and second magnetic parts, which is preferably shorter than the distance between the sample facing ends of the second magnetic part and the outer pole piece in the first position. This case provides that the second focal length is shorter than the first focal length, resulting in a corresponding increased magnification and higher resolution of the lens with the second position compared to the first position.

In certain preferred embodiments, in the second position of an outer moveable element, the lens works with a larger effective diameter central pole piece, which diameter is increased by the first magnetic part of the outer moveable element, and a typically longer flux return path resulting in a typically longer working distance and decreased magnification.

The present invention also provides a method of focusing charged particles emitted from a sample comprising:

providing a magnetic lens in proximity to the sample for generating a magnetic imaging field to focus the charged particles;

energizing the magnetic lens to generate the magnetic imaging field;

causing charged particles to be emitted from the sample; and focusing at least some of the charged particles emitted from the sample to produce a charged particle image of the sample;

wherein the magnetic lens is a magnetic lens according to the present invention.

Other features of the method will be apparent to those skilled in the art. For example, the sample is preferably located on the axis of the imaging field and the magnetic lens is located behind the sample, i.e. opposite from the side from which the charged particles are emitted such that the particles emitted from the sample are brought to a focus by the field.

The method may comprise moving the or at least one moveable element of the lens thereby to change the focal length of the lens and change the magnification of the image, i.e. the method may comprise a step of changing the magnification of the image by moving the or at least one moveable element of the lens. The method may comprise changing the magnification of the image by moving the or at least one moveable element of the lens between first and second positions as herein described. The method may comprise energizing the lens when the or at least one moveable element is in a first position thereby defining a first focal length of the lens (and therefore a first magnification) and providing the lens in proximity to the sample positioned at a first analysis position. The first analysis position of the sample defines a first working distance, wherein a working distance is defined as the distance from the analysis position to the top of the lens. The method may comprise energizing the lens when the or at least one moveable element is in a second position thereby defining a second focal length (and therefore a second magnification) of the lens and providing the lens in proximity to the sample positioned at a second analysis position. The second analysis position thereby defines a second working distance. Preferably, the second analysis position is not substantially different from the first analysis position. The method may comprise energizing the lens when a further moveable element is in a second position thereby defining a third focal length (and therefore a third magnification) of the lens and providing the lens in proximity to the sample positioned at a third analysis position. The third analysis position thereby defines a third working distance. Preferably, the third analysis position is not substantially different from the first and/or second analysis position.

It will be appreciated, however, that it may be necessary to move the position of the sample with respect to the lens when the focal length of the lens is changed so that the sample is positioned at the most efficient working distance from the lens. Movement of the sample is achievable with conventional sample manipulators, e.g. as used in vacuum chambers.

As with conventional magnetic lenses, the magnetic field generated by the lens causes charged particles having energies within a certain energy range to be imaged. The resulting charged particle image can then be energy analyzed by a suitable energy analyzer according to methods known in the art. By synchronously changing the strength of the magnetic imaging field and scanning the energy analyzer, a spectrum of the energies of the charged particles can be obtained. Preferably, the charged particles are emitted from a surface region of the sample, e.g. photoelectrons, and the spectrum yields information about the nature and composition of the sample, especially a surface region thereof.

The present invention further provides a charged particle energy analyzer for analyzing a selected area of the surface region of a sample comprising: a sample holder; a source of radiation for causing the emission of charged particles from a sample held on the sample holder; a magnetic lens for focusing at least some of the charged particles emitted from the sample; and analyzing means for analyzing the energy of the focused charged particles emitted from the sample, wherein the magnetic lens is a magnetic lens according to the present invention.

The sample is preferably located on the axis of the lens and the magnetic lens is located behind the sample, i.e. where the charged particles are emitted from the front of the sample, such that the particles emitted from the sample are brought to a focus by the field.

Preferably, the sample is a solid sample and the charged particles are photoelectrons, i.e. the analyzing means is an electron analyzer. More preferably, the radiation comprises X-rays or ultraviolet rays, most preferably X-rays. Other features of the charged particle energy analyzer will be apparent to those skilled in the art.

In particular embodiments, the invention provides a photoelectron spectroscopy system for analyzing a selected area of the surface region of a sample comprising: a sample holder for holding a sample; a source of x-ray or ultraviolet radiation for causing the emission of photoelectrons from a sample held on the sample holder; a magnetic lens for focusing at least some of the photoelectrons emitted from the sample; and electron analyzing means for analyzing the energy of the focused photoelectrons emitted from the sample, wherein the magnetic lens is a magnetic lens according to the present invention.

The present invention additionally provides a method of analyzing a selected area of a surface region of a sample comprising: providing a sample on a sample holder; irradiating a surface region of the sample with radiation thereby causing the emission of charged particles from the surface region; focusing at least some of the emitted charged particles using a magnetic lens; and analyzing the energy of the focused charged particles; wherein the magnetic lens is a magnetic lens according to the present invention.

Preferably, the sample is a solid sample and the charged particles are photoelectrons. Preferably, the radiation is electromagnetic radiation, especially ultraviolet radiation or x-rays, more especially x-rays. Other features of the method of analyzing a selected area of a surface region will be apparent to those skilled in the art.

The invention provides a magnetic lens for focusing charged particles emitted from a sample that can be operated in vacuum having a zoom facility to provide both a high magnification for high resolution analysis and a lower magnification having much reduced restriction on sample thickness for routine analysis. This has not been possible with the prior art. This advantage is achieved by means of creating different magnetic circuits within the magnetic lens by utilizing at least one moveable element, e.g. of the central pole piece and/or outer pole piece, which can be moved with high accuracy without disturbing the position of the remainder of the lens. The zoom (change in magnification) between the two or more positions of the lens may be a factor of 2× or more, preferably 3× or more. The zoom may typically be from 2× to 4×, for example, a factor of about 3×. The magnification in the first position may be typically from about 6× to about 12×, e.g. 12×, and the magnification in the second position (zoom-in) may be typically from about 20× to about 40×. e.g. 40×. The magnification in a third position (zoom-out) may be typically from about 4× to about 8×, e.g. from about 4× to about 6×, e.g. 6×. As an example, the magnification in the first position may be 12× and the magnification in the second position (zoom-in) may be 40×. However, these ranges are not limiting on the scope of the invention.

Various embodiments of the invention will now be described by way of example and with reference to the Figures described below. It will be understood that the embodiments described are examples only and are not limiting on the scope of the invention. Moreover, features described in the context of the various embodiments have general applicability and are not limited to the embodiments shown.

Referring to FIG. 1A, there is shown schematically a cross-sectional side view of a snorkel lens 10 according to a conventional design. The snorkel lens comprises a central pole piece 2 lying on the lens axis A-A, a co-axial annular outer pole piece 4 constituting a magnetic flux return path which surrounds the central pole piece 2 defining therebetween an annular space, and an energizing copper coil 6 surrounded with associated former and cooling coils 8 disposed within the annular space. The central pole piece 2 is of circular transverse cross-section (i.e. cross-section in a plane perpendicular to the lens axis A-A) and has a sample facing end 3 of decreasing diameter in a forward direction, i.e. toward the sample. The outer pole piece 4 is likewise circular in its transverse cross-section. The outer pole piece 4 has an annular, sample facing end 5 directed inwardly toward the central pole piece 2. The central pole piece 2 and outer pole piece 4 are connected together by base piece 12 integral with central pole piece 2.

The lens 10 sits close behind a solid sample S which is held by a sample holder (not shown). The snorkel lens is mounted securely within a vacuum chamber (not shown) that also houses the sample as well as other optional charged particle optics and analyzing means of a surface analysis system. The lens is mounted rigidly and precisely in order for a high imaging resolution to be achieved.

The axis of the magnetic imaging field is co-axial with the axis A-A of the lens, which runs through the central pole piece, and the magnetic imaging field is substantially symmetrical about the lens axis.

Figure 1B:
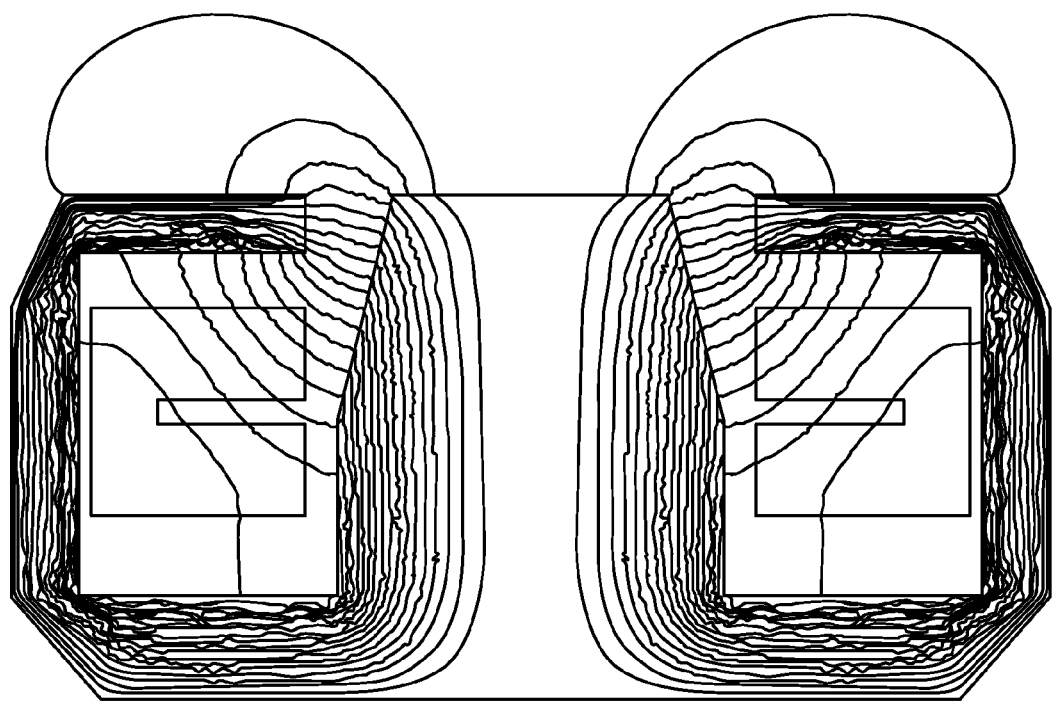
FIG. 1B shows magnetic modeling of the magnetic flux density of the lens of the conventional design shown in FIG. 1A.

In use, charged particles, such as photoelectrons for example, are caused to be emitted from the sample surface, e.g. by irradiating the sample with electromagnetic radiation such as ultraviolet radiation or x-rays from a radiation source (not shown). The charged particles to be focused are emitted from the sample surface distant from the lens and the focused particles are brought to a focus F on an image plane I-I. The energizing coil is energised so that that the imaging field is of such strength as to focus emitted particles of the selected energy. Magnetic flux densities of the imaging field of the snorkel lens of FIG. 1A that can be achieved using soft iron or nickel iron materials, as calculated with magnetic modeling, are shown in FIG. 1B, with the magnetic field lines indicated as well as the lens and field axis A-A. The particles brought to focus are emitted from a selected small area of the sample, the size of which is determined by the resolution of the lens. At the focus F may be positioned an aperture so that only the particles from the selected small area of interest are passed onward down the remainder of the optical path to an energy analyzer for example (not shown).

The snorkel lens shown in FIG. 1A has a single focal length which is essentially fixed by the geometry and dimensions of the lens. Consequently, the magnification or resolution cannot be significantly changed. If the snorkel lens were to be dimensioned for a very short focal length (i.e. high resolution), then the sample would need to be positioned at a very short working distance from the lens, which would make routine analysis of samples greater than a certain thickness impractical.

Figure 2A:
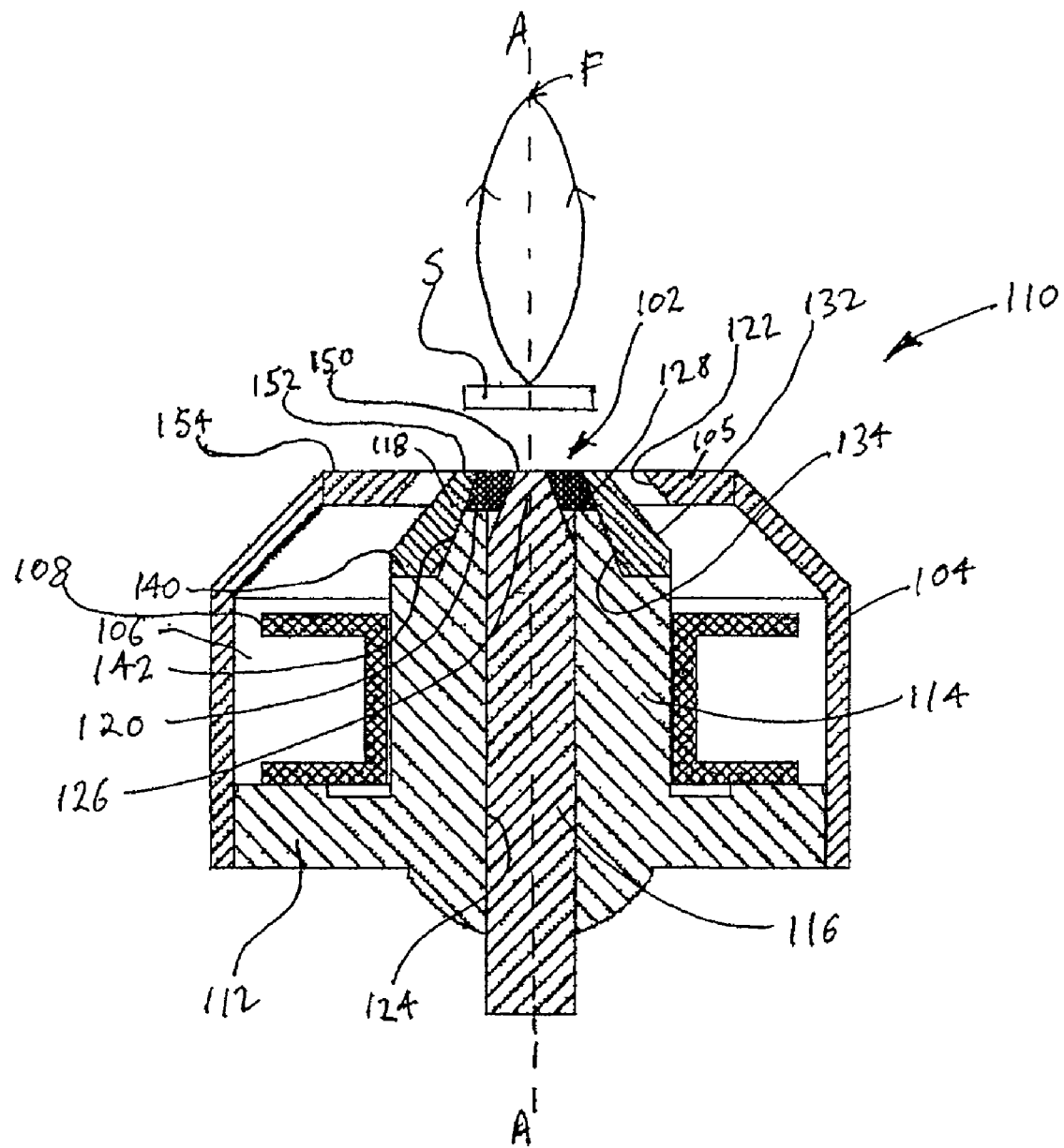
FIG. 2A shows schematically a cross-sectional side view of an embodiment of a magnetic lens according to the present invention with the lens in a first position.

Referring to FIG. 2A there is shown schematically an embodiment of a lens 110 according to the present invention with the lens in a first or normal position. The lens 110 is generally suitable for use in the same type of applications as the snorkel lens 10, e.g. XPS or UPS. The lens 110 is of generally the same overall dimensions as the snorkel lens 10. The outer diameter of the complete magnetic lens 110 assembly is typically about 100 mm. Typically, in the first or normal position shown in FIG. 2A, the central pole piece has an outer diameter at its sample facing end (i.e. across sample facing end 152) of about 20 mm and the outer pole piece (flux return) has an inner diameter of about 40 mm.

The lens 110 again sits close behind a solid sample S held by a sample holder (not shown). The lens 110 is once again mounted securely within the vacuum chamber (not shown) that also houses the sample S as well as other charged particle optics and analyzing means of a surface analysis system. The lens is mounted rigidly and precisely in order for a high imaging resolution to be achieved.

The lens 110 comprises a central pole piece shown generally by reference 102, a co-axial annular outer pole piece 104 constituting a magnetic flux return path which surrounds the central pole piece 102 defining therebetween an annular space and an energizing copper energizing coil 106 surrounded with associated cooling coils 108 disposed within the annular space. The central pole piece 102 is of circular transverse cross-section (i.e. in a plane perpendicular to the lens axis A-A) and lays on the lens axis A-A. The axis of the magnetic imaging field is co-axial with the axis A-A of the lens, which runs through the central pole piece, and the magnetic imaging field is substantially symmetrical about the lens axis.

The annular outer pole piece 104, which is symmetrical about the lens axis A-A, is also circular in its transverse cross-section and has a circular annular, sample facing end 105 extending inward toward the central pole piece 102. The inwardly extending sample facing end 105 of the outer pole piece has an internal diameter which decreases in the direction of the sample which results in the end 105 having an inner surface 122 facing the central pole piece which has a conical profile.

The central pole piece, which is symmetrical about the lens axis A-A, is shown generally by reference 102 is a composite pole piece comprising a body 114 of magnetic material and a moveable element, accommodated in the body 114, which moveable element comprises a first magnetic part 116 and a second magnetic part 118, first and second magnetic parts 116 and 118 being spaced apart by non-magnetic part 120. The central pole piece 102 and outer pole piece 104 are connected together by base piece 112 integral with the body 114 of the central pole piece.

The body 114 of the central pole piece is circular in transverse cross section and has a through-bore 124 also circular in transverse cross section. The through-bore accommodates therein the moveable element of the central pole piece, specifically the first magnetic part 116 thereof. The first magnetic part 116 is in connection with the body 114 of the central pole piece so that it forms part of the central pole piece in all working positions of the moveable element. The first magnetic part 116 is slidable in the through-bore 124 of the body 114 thereby permitting movement of the moveable element in use.

The first magnetic part 116, which is symmetrical about the lens axis A-A, is an elongate circular section member having a sample facing end 126 of decreasing external diameter toward the sample thus providing an outer surface 128 thereof having a conical profile. The moveable element further comprises a non-magnetic part or spacer 120, made of a non-magnetic material such as copper, phosphor bronze or stainless steel, which is symmetrical about the lens axis A-A and which is fixedly mounted about and in connection with the sample facing end 126 of the first magnetic part 116. The second magnetic part 118 of the moveable element, which is symmetrical about the lens axis A-A, is in the form of a magnetic annular member which is fixedly mounted about and in connection with the non-magnetic part 120, thereby being spaced apart from the first magnetic part 116. The second magnetic part 118 has an outer surface 132 profiled for engagement, in a second working position described below with reference to FIG. 3A, with the inner surface 122 of the inwardly extending sample facing end 105 of the outer pole piece. Specifically, the second magnetic part 118 has an external diameter which decreases in the direction of the sample, such that it has an outer surface 132 with a conical profile, which tapers in the direction of the sample. To ensure sufficient engagement between them in the second position described with reference to FIG. 3A below, the second magnetic part 118 has a maximum external diameter (i.e. its largest external diameter) greater than the minimum internal diameter (i.e. its smallest internal diameter) of the sample facing end 105 of the outer pole piece. The second magnetic part 118 also has an inner surface 134 with a profile corresponding to the profile of the outer surface 128 of the end of the first magnetic part 126, i.e. with decreasing internal diameter in the direction of the sample, such that the surfaces 128 and 134 are approximately parallel (preferably substantially parallel) over the length of the end of the first magnetic part 126 having decreasing diameter.

The dimensions of the central pole piece 102 and outer pole piece 104 of the lens shown in FIG. 2A are similar to those of the corresponding pole pieces 2 and 4 of the conventional lens shown in FIG. 1A. In the first or normal working position of the lens as shown in FIG. 2A, i.e. with the moveable element of the central pole piece 102 in a first working position, both first and second magnetic parts 116 and 118 of the moveable element constitute part of the central pole piece 102. In more detail, the first position has the first magnetic part 116 of the moveable element retracted as far as possible into the through-bore 124 of the body 114 of the central pole piece. In doing so, the second magnetic part 118 connects with axial end surface 140 and radial end surface 142 of the body 114. The close contact of the first and second magnetic parts 116 and 118 with the magnetic body 114 result in both the first and second magnetic parts 116 and 118 constituting part of the central pole piece. In the first position, sample facing surfaces 150 and 152 of the sample facing ends of the first and second magnetic parts 116 and 118 respectively are substantially flush with the sample facing surface 154 of the sample facing end 105 of the outer pole piece 104, i.e. the central pole piece does not extend out of the lens beyond the outer pole piece 104.

Figure 2B:
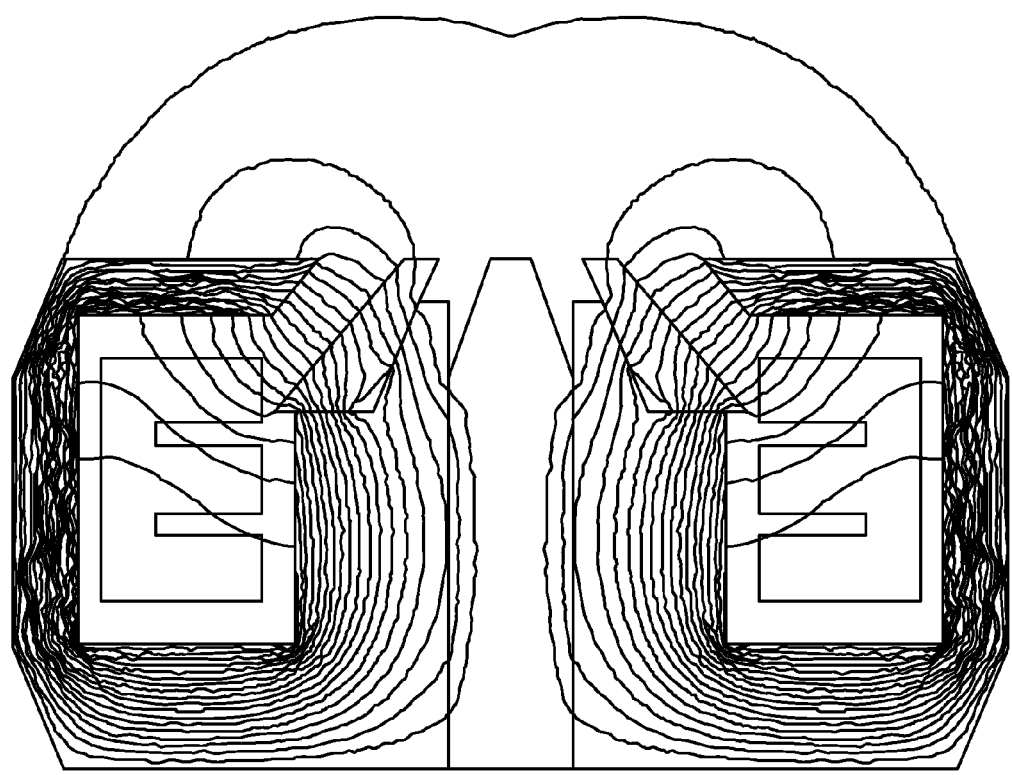
FIG. 2B shows magnetic modeling of the magnetic flux density of the lens of the present invention in the first position shown in FIG. 2A.

FIG. 2B shows magnetic modeling of the lens of the present invention in the first position shown in FIG. 2A. The inclusion of the non-magnetic part 120 has no significant effect on the electron optical properties (e.g. focal length and aberration coefficient) of the lens compared with a conventional lens. However, the magnetic flux density in the material of the moveable element is larger and so it is preferably made of a material with a higher magnetic saturation field such as an Iron-Cobalt alloy (e.g. Permendur™).

The lens in the first or normal working position shown in FIG. 2A provides a first focal length. Example dimensions and parameters of the lens in a first working position are given in Table 1 below.

TABLE 1

| Lens parameters in first position | |
|---|---|
| Central pole piece diameter at tip | 20 mm |
| Flux return path inner diameter | 40 mm |
| Focal length | 10 mm |
| Working distance [from sample analysis position to top surface of magnet] | 13 mm |
| Spherical Aberration Coefficient Cs | 3 mm |
| Magnification | 12 x |
| Imaging Resolution | 3 micron typically. 1 micron with greatly reduced sensitivity. |

The lens of the present invention may be used in similar applications to the prior art. For example, in use, charged particles, such as photoelectrons for example, may be caused to be emitted from the sample surface, e.g. by irradiating the sample with electromagnetic radiation such as ultraviolet radiation or x-rays from a radiation source (not shown). The charged particles to be focused are emitted from the sample surface distant from the lens and the focused particles are brought to a focus F on an image plane. In use, the energizing coil is energised so that that the imaging field is of such strength as to focus emitted particles of the selected energy. Typically, to focus particles having an energy of 1000 eV a magnetic field of the order of 300 gauss is required. The energisation required from the coil winding is not significantly different in either of the first (normal) or second (zoom-in) working positions of the lens according to the present invention compared to that in the conventional design.

The particles brought to focus are emitted from a selected small area of the sample, the size of which is determined by the resolution of the lens. At the focus F may be positioned an aperture so that only the focused particles are passed onward down the remainder of the optical path to an energy analyzer for example (not shown).

In addition to operating the lens of the present invention with the first focal length as described with reference to FIG. 2A, the lens may be operated with a second, shorter focal length which thereby increases magnification and improves spatial resolution of the image. This is achieved by operating the lens with the moveable element of the central pole piece in a second working position as now described with reference to FIG. 3A. For operation of the lens in the second or zoom-in position, the first magnetic part 116 is moved forward in the through-bore 124 of the body 114 of the central pole piece so that the sample facing end 126 of the first magnetic part 116 is positioned forward (i.e. in the direction of the sample) of the sample facing end 105 of the outer pole piece 104. The first magnetic part 116 is moved forward such that the conical profiled outer surface 132 of the second magnetic part 118 engages with the inner surface 122 of the inwardly extending sample facing end 105 of the outer pole piece to thereby form part of the outer pole piece. The movable element is actuated either by an in-vacuum pneumatic device (e.g. bellows actuator) or an in-vacuum electrical device (e.g. in-vacuum stepper motor). In the second position, the sample facing surfaces 150 and 152 of the first and second magnetic parts 116 and 118 respectively are positioned forward of sample facing surface 154 of the sample facing end 105 of the outer pole piece 104, i.e. the central pole piece extends out of the lens beyond the outer pole piece 104. Typically, in the second or zoom-in position, the central pole piece has an outer diameter (i.e. diameter of the end surface 150) of 6 mm and the outer pole piece has an inner diameter (i.e. inner diameter of the sample facing end 152) of 10 mm.

In the second (i.e. extended or zoom-in) position, whilst the first magnetic part 116 of the moveable element remains in connection with the body 114 of the central pole piece such that the first magnetic part 116 remains part of the central pole piece, the second magnetic part 118 of the moveable element is now in connection with the outer pole piece 104 such that the second magnetic part 118 forms part of the outer pole piece. In this way, the magnetic flux path becomes modified and the relatively short distance between the first and second magnetic parts 116 and 118 of the moveable element and the narrower effective diameter of the central pole piece as constituted by the diameter of the end 126 of the first magnetic part 116 thereby defines a second focal length of the lens, in this embodiment shorter than the first focal length. Thus, operation in the second or zoom-in position thus provides a magnetic lens capable of providing a magnified charged particle image of the sample compared with operation in the first position.

Figure 3A:
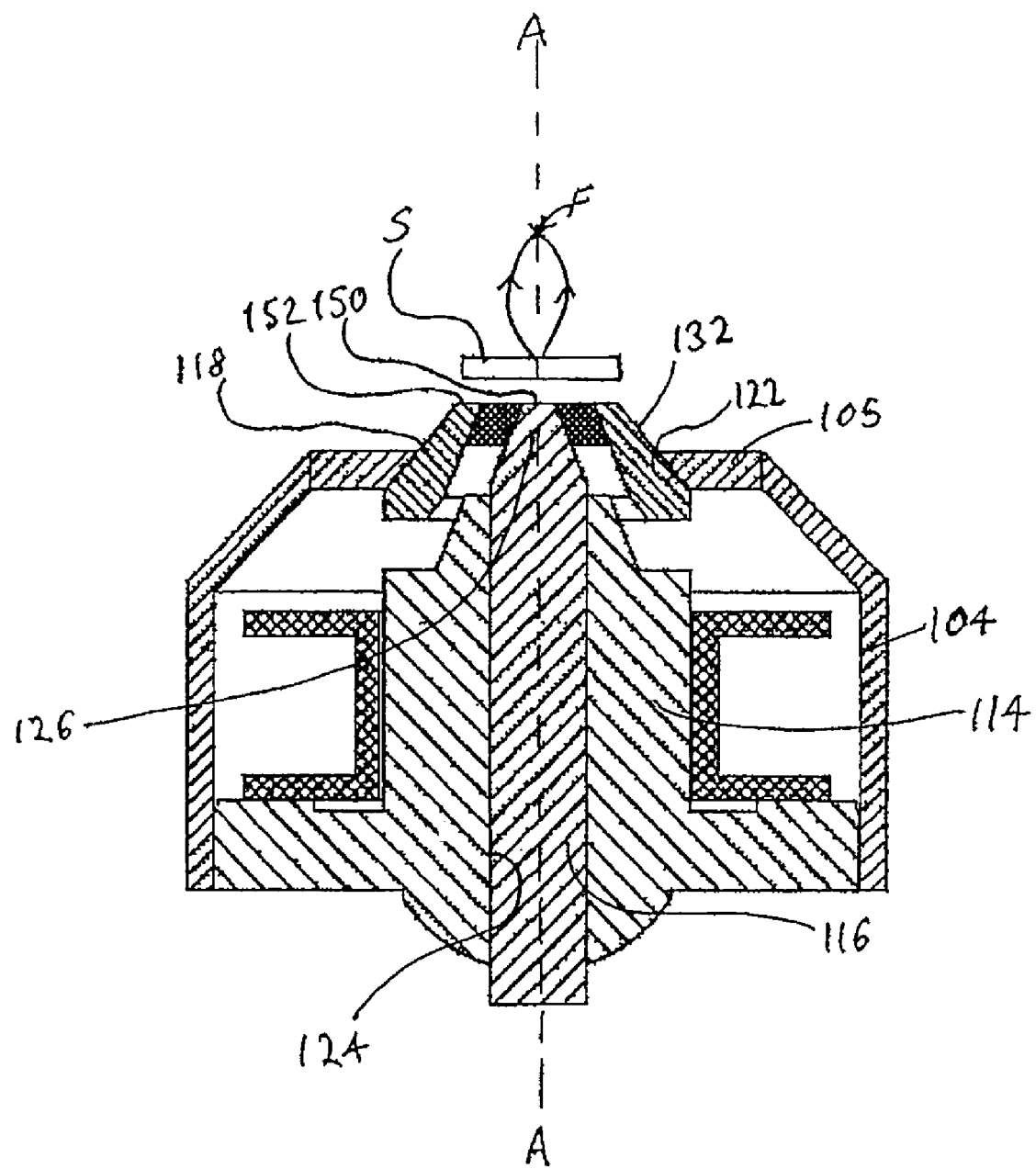
FIG. 3A shows schematically a cross-sectional side view of an embodiment of a magnetic lens according to the present invention as in FIG. 2A with the lens in a second position.
Figure 3B:
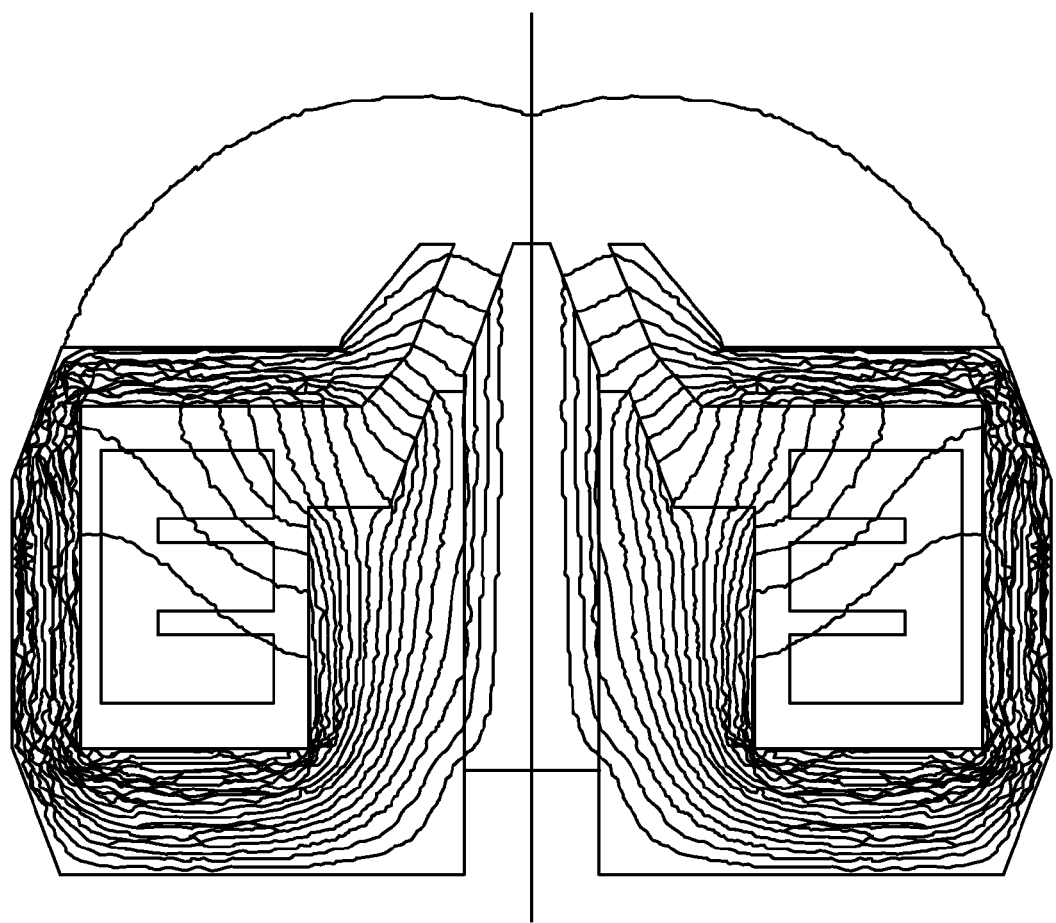
FIG. 3B shows magnetic modeling of the magnetic flux density of the lens of the present invention in the second position shown in FIG. 3A.

FIG. 3B shows magnetic modeling of the lens of the present invention in the second position shown in FIG. 3A. The magnetic flux density in the material of the moveable element is larger than in a conventional lens and so it is preferably made of a material with a higher magnetic saturation field such as an Iron-Cobalt alloy (e.g. Permendur™).

The lens in the second or zoom-in working position shown in FIG. 3A provides a second focal length. Example dimensions and parameters of the lens in a second working position are given in Table 2 below.

TABLE 2

| Lens parameters in second or zoom-in position | |
|---|---|
| Central pole piece diameter at tip | 6 mm |
| Flux return path inner diameter | 10 mm |
| Focal length | 3 mm |
| Working distance [from sample analysis position to top of magnet] | 5 mm |
| Spherical Aberration Coefficient Cs | 1 mm |
| Magnification | 40 x |
| Imaging Resolution | Less than 1 micron |

The dimensions of the lens shown in Tables 1 and 2 demonstrate that the difference in focusing between the two positions of the lens represents a zoom factor of over 3× (i.e. 3 times the magnification). By selecting other dimensions higher or lower zoom factors might be achieved as desired. By including more than one moveable element in the lens design, a larger number of different focal lengths may be achieved.

An example having a second magnetic moveable element in the form of a moveable outer pole piece will now be described with reference to FIGS. 5A-C. In addition to the zoom-in facility provided by the embodiment shown in FIGS. 2A and 3A, the example shown in FIGS. 5A-C also provides a zoom-out facility with a third focal length.

Figure 5A:
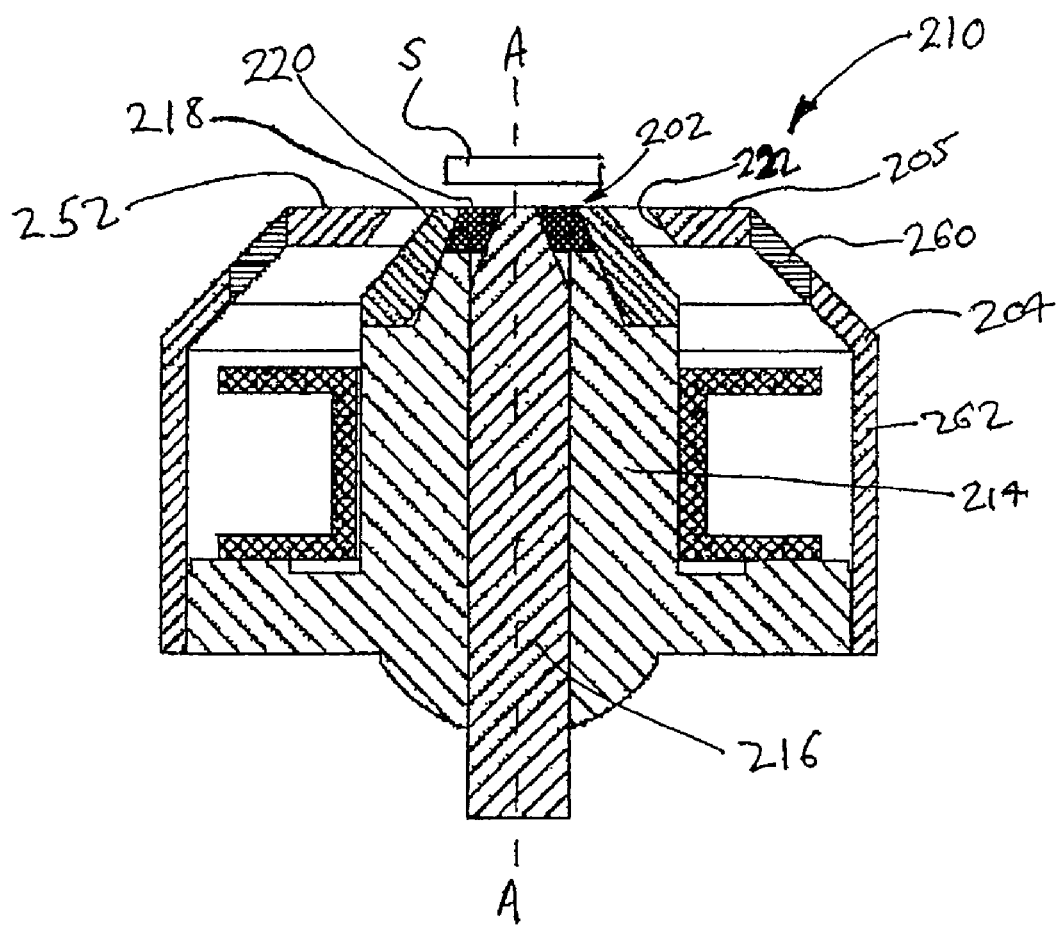
FIG. 5A shows schematically a cross-sectional side view of a further embodiment of a magnetic lens according to the present invention with the lens in a first normal position.

Referring to FIG. 5A there is shown schematically an embodiment of a lens 210 according to the present invention with the lens in a first or normal position. The lens 210 is of generally similar construction to the lens 110 shown in FIGS. 2A and 3A, i.e. with a composite central pole piece 202 comprising a body 214 of magnetic material and a moveable element, accommodated in the body, as described above, which moveable element comprises a first magnetic part 216 and a second magnetic part 218, first and second magnetic parts 216 and 218 being spaced apart by non-magnetic part 220. In this normal working position where the central pole piece has a diameter of typically 20 mm it produces a lens with a focal length of about 12 mm.

Figure 5B:
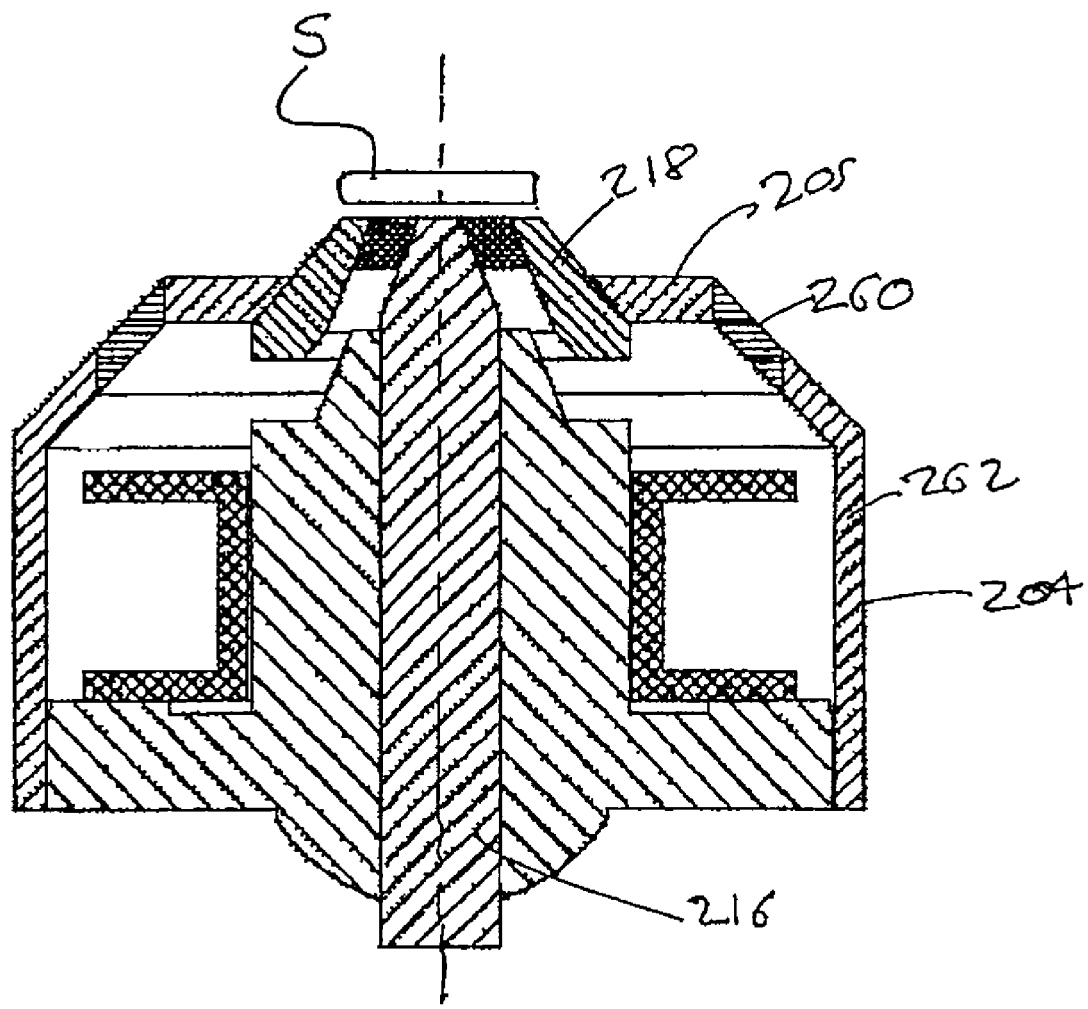
FIG. 5B shows schematically a cross-sectional side view of the further embodiment of a magnetic lens according to the present invention as in FIG. 5A with the lens in a second zoom-in position.

Referring to FIG. 5B, there is shown the same embodiment of lens as FIG. 5A but with the lens 210 in a second or zoom-in position, i.e. with the moveable element of the central pole piece 202 extended with respect to the lens in the manner described above with reference to FIG. 3A. In this position, a higher magnification is provided by the lens. In this zoom-in position, the moveable element of the central pole piece has been raised so that the central pole piece now has an effective diameter of typically 6 mm and produces a lens with a focal length of about 4 mm.

Figure 5C:
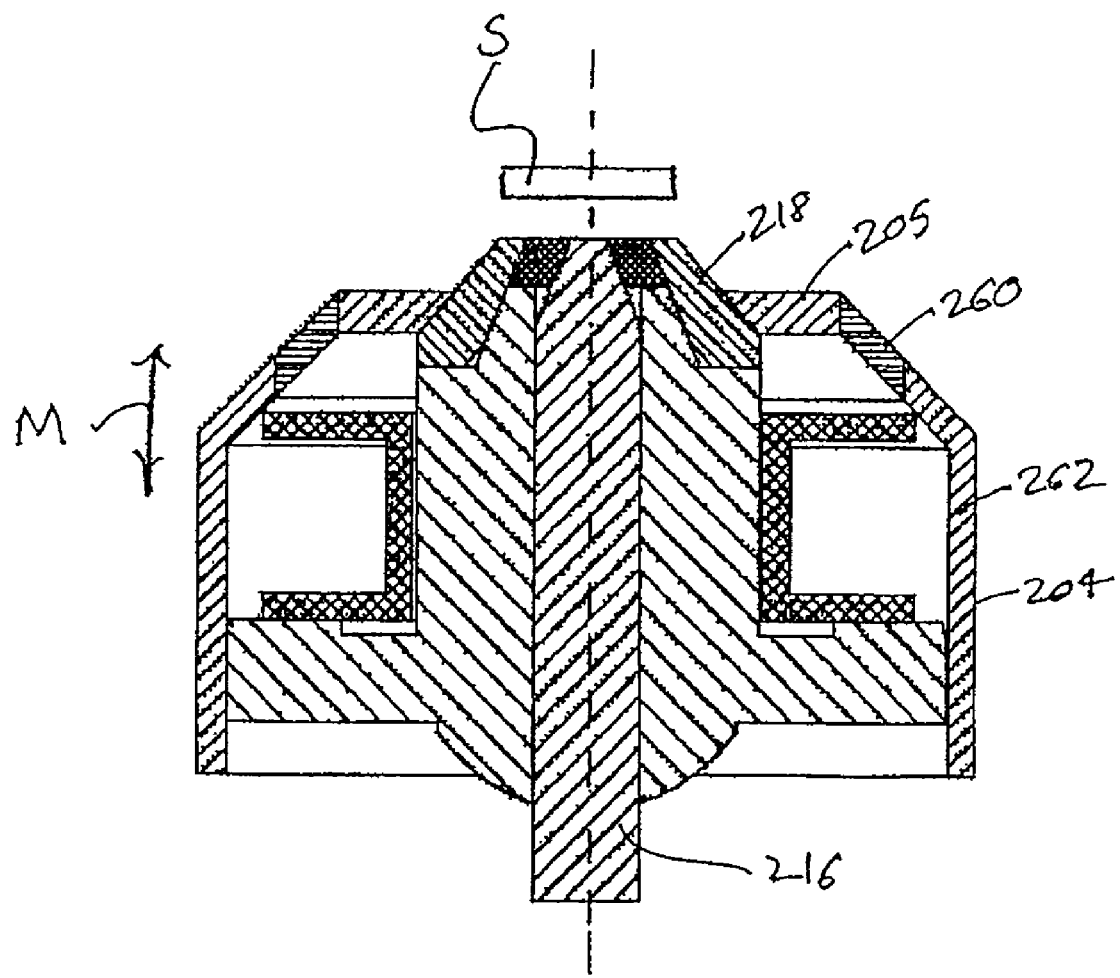
FIG. 5C shows schematically a cross-sectional side view of the further embodiment of a magnetic lens according to the present invention as in FIG. 5A with the lens in a third zoom-out position.

With reference to FIGS. 5A-C, the main difference in construction of the lens 210 from the embodiments shown FIGS. 2A and 3A lies in the outer pole piece 204, which in this embodiment is of composite construction rather than a single piece. The outer pole piece 204 of the lens 210 comprises an annular outer pole piece, which is symmetrical about the lens axis A-A, is also circular in its transverse cross-section and has a circular annular, sample facing end 205 extending inward toward the central pole piece 202. The inwardly extending sample facing end 205 of the outer pole piece again has an internal diameter which decreases in the direction of the sample which results in the end 205 having an inner surface 222 facing the central pole piece which has a conical profile. The sample facing end 205 in this embodiment is a separate part made of magnetic material and is fixedly connected to an annular shoulder part 260 of the outer pole piece which is made of a non-magnetic material such as copper, phosphor bronze or stainless steel for example. The non-magnetic part 260 is in turn fixedly connected to a further magnetic annular body 262 so that the non-magnetic part 260 sits in the middle between the magnetic parts 205 and 262 of the outer pole piece. The whole of the outer pole piece 204 is moveable with respect to the central pole piece 202 and the remainder of the lens, i.e. moveable up and down in the direction of the vertical arrow M.

Referring to FIG. 5C, there is shown the embodiment of lens as in FIG. 5A but with the lens 210 in a third or zoom-out position, i.e. with the moveable outer pole piece 204 retracted into the lens so that the magnetic sample facing end 205 of the outer pole piece makes contact with the central pole piece 202 and thereby the sample facing end 205 becomes part of the central pole piece in the magnetic circuit because it is insulted from the magnetic body 262 of the outer pole piece by the non-magnetic part 260. In this zoom-out position, with the outer pole piece retracted or lowered it gives a central pole piece with an effective diameter of typically 30 mm and produces a lens with a focal length of about 20 mm.

Typically, the focal length is from about 40% to about 80% of the effective diameter of the central pole-piece, more typically from about 45% to 75% of the effective diameter of the central pole-piece and still more typically from about 50% to 70% of the effective diameter of the central pole-piece, e.g. 45%, 50%, 55%, 60%, 65%, 70% or 75% of the effective diameter of the central pole-piece.

Figure 4A:
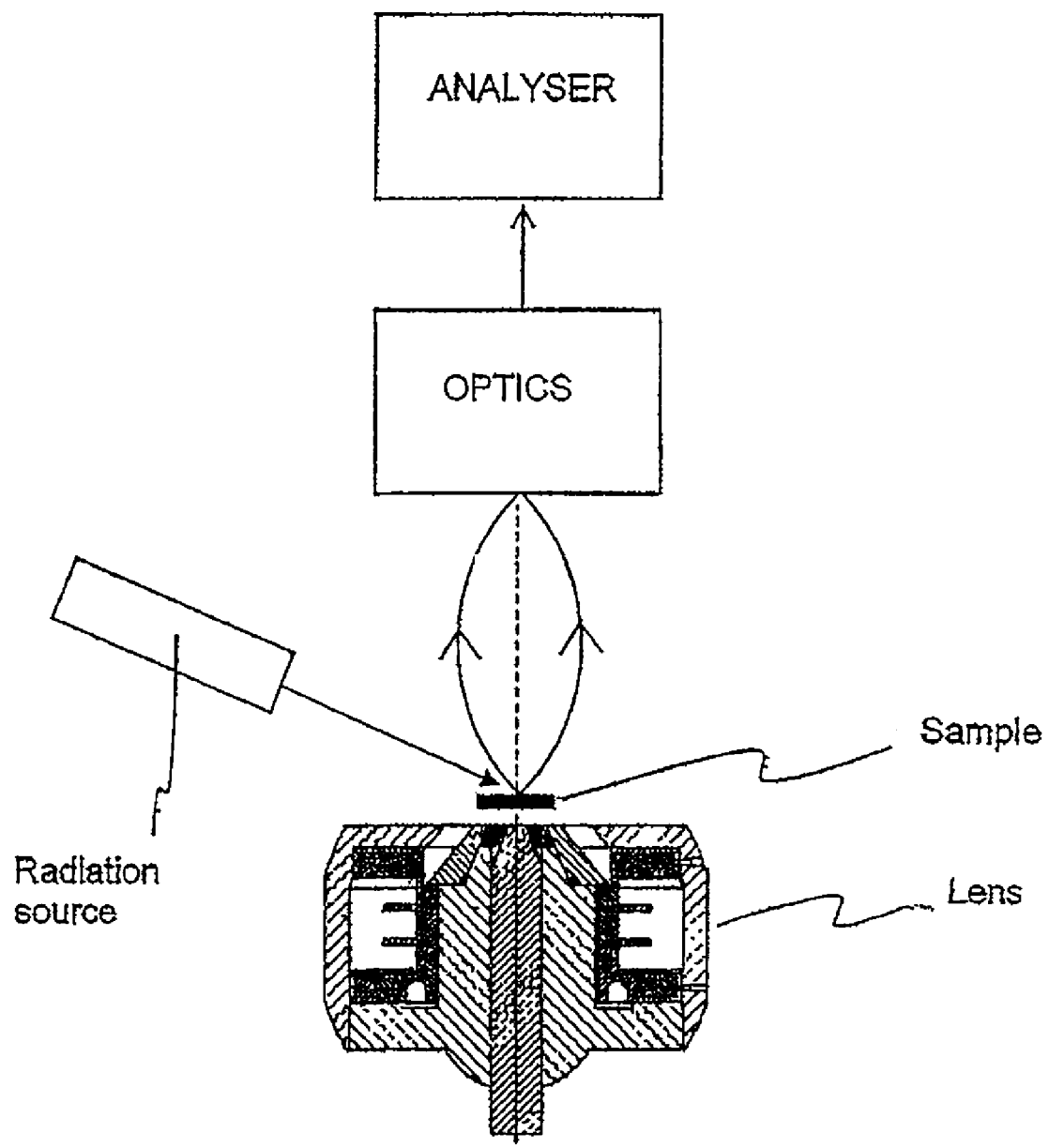
FIG. 4A shows schematically an embodiment of a charged particle energy analyzer according to the present invention with the lens in the first position.
Figure 4B:
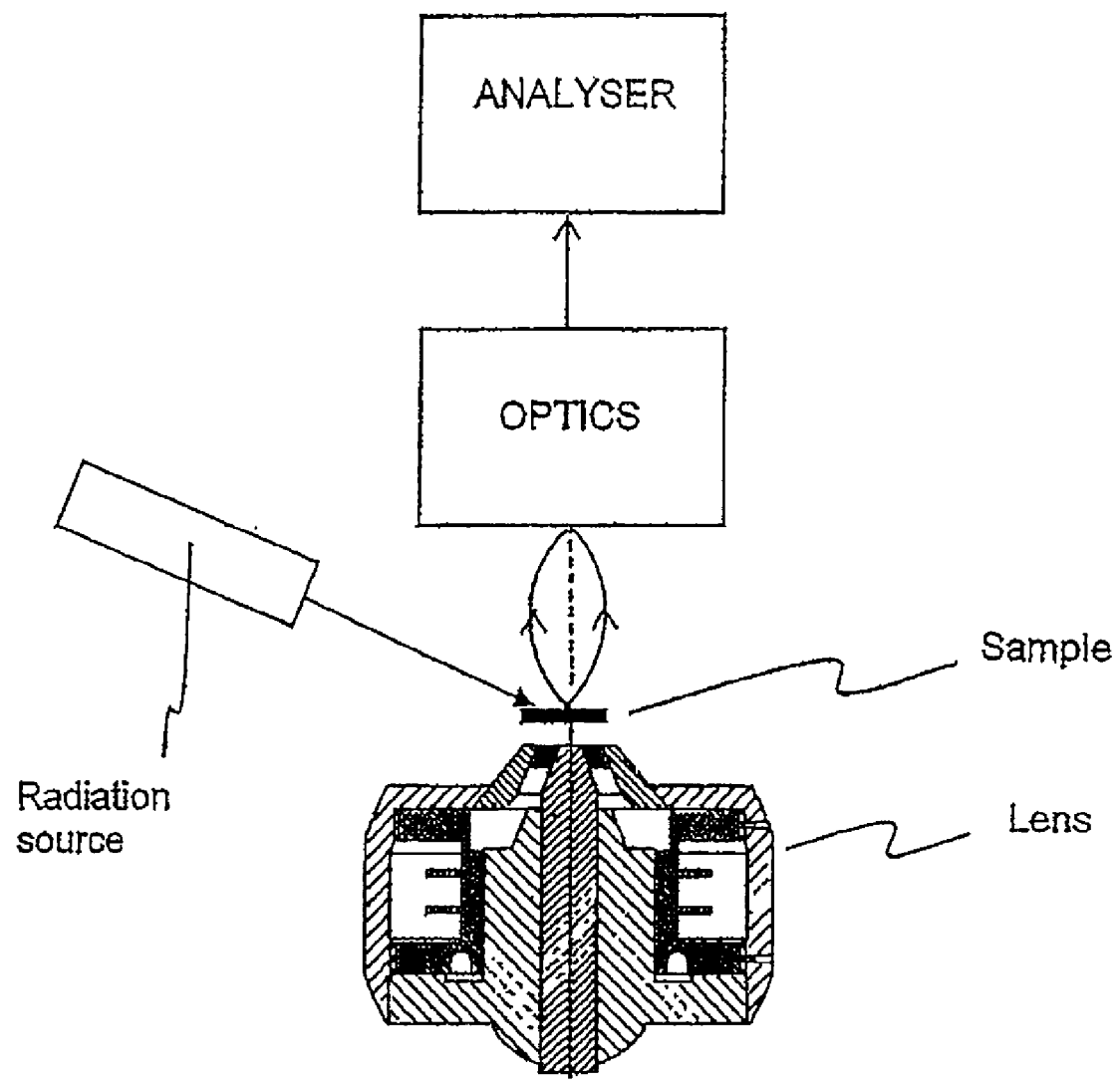
FIG. 4B shows schematically an embodiment of a charged particle energy analyzer according to the present invention with the lens in the second position.

The lens of the invention may be used in a charged particle energy analyzer, i.e. to provide an imaging capability. The energy analyzer may be of conventional design other than using the lens of the invention. Accordingly, the lens of the present invention may be used in conventional charged particle energy analyzers. For illustration only, a schematic representation of a charged particle energy analyzer is shown in FIGS. 4A and 4B. Referring to FIGS. 4A and 4B, there is shown a sample which is held on a sample holder (not shown, for clarity), a source of radiation (e.g. X-rays etc.) for irradiating the front of the sample to cause the emission of charged particles (e.g. photoelectrons) from the sample. The magnetic lens is positioned behind the sample, the lens being shown in its first position in FIG. 4A and in its second position in FIG. 4B. The emitted particles of a selected range of energy as determined by the magnetic field strength are focused first by the magnetic lens and passed through further optics for guiding and/or focusing the charged particles along a path into an energy analyzer for analyzing the energy of the charged particles such as an electrostatic type analyzer (e.g. a concentric hemispherical analyzer (CHA) or a cylindrical mirror analyzer (CMA)). The sample, lens and analyzer are all held in a vacuum chamber (not shown, for clarity).

Whilst in the foregoing description the central pole piece comprises the moveable element, it should be understood that it is the relative movement between the element and the outer pole piece that forms part of the invention. For example, if it were desirable to maintain a constant distance between the central pole piece and the sample, the outer pole piece could be moved away from the sample in order to increase the magnification of the lens (i.e. to achieve the second position of the lens) in accordance with the invention.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

Unless the context clearly indicates otherwise, as used herein plural forms of the terms herein are to be construed as including the singular form and vice versa.

Throughout the description and claims of this specification, the words "comprise", "including", "having" and "contain" and variations of the words, for example "comprising" and "comprises" etc, mean "including but not limited to", and are not intended to (and do not) exclude other components.

The use of any and all examples, or exemplary language (e.g., "for instance", "such as", "for example") provided herein, is intended merely to better illustrate the invention and does not indicate a limitation on the scope of the invention unless otherwise claimed. No language in the specification should be construed as indicating any non-claimed element as essential to the practice of the invention.

Any steps described in this specification may be performed in any order or simultaneously unless stated or the context requires otherwise.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

What is claimed is:

1. A magnetic lens for generating a magnetic imaging field to focus charged particles emitted from a sample, the lens comprising a central pole piece and an outer pole piece disposed about the central pole piece, wherein the lens comprises at least one magnetic moveable element for movement relative to at least one of the pole pieces, whereby a focal length of the lens is variable by said movement of the at least one magnetic moveable element.

2. A magnetic lens as claimed in claim 1 wherein said movement of the at least one magnetic moveable element changes the magnetic circuit between the pole pieces.

3. A magnetic lens as claimed in claim 1 wherein the central pole piece comprises a magnetic moveable element which comprises a magnetic part which, in a first position, forms at least part of the central pole piece whereby a first magnetic circuit is generated and, in a second position, forms part of the outer pole piece whereby a second magnetic circuit is generated, different from the first magnetic circuit.

4. A magnetic lens as claimed in claim 1 wherein the at least one magnetic moveable element comprises a first magnetic part and a second magnetic part, said first magnetic part and second magnetic part being separated by a non-magnetic part.

5. A magnetic lens as claimed in claim 4 wherein the at least one magnetic moveable element is moveable between at least a first position and a second position, wherein, in the first position it defines a first focal length of the lens and, in the second position it defines a second focal length of the lens.

6. A magnetic lens as claimed in claim 4 wherein the first magnetic part comprises a magnetic elongate member.

7. A magnetic lens as claimed in claim 4 wherein the first magnetic part has a sample facing end which has an external diameter which decreases in the direction of the sample.

8. A magnetic lens as claimed in claim 4 wherein the second magnetic part comprises a magnetic annular member which is disposed about the first magnetic part.

9. A magnetic lens as claimed in claim 8 wherein the second magnetic part has an outer surface profiled for engagement with a complementarily profiled inner surface of the outer pole piece.

10. A magnetic lens as claimed in claim 4 wherein the second magnetic part has a maximum external diameter which is greater than the minimum internal diameter of the outer pole piece.

11. A magnetic lens as claimed in claim 1 wherein the central pole piece and the outer pole piece are symmetrical about an axis of the lens and the outer pole piece is annularly disposed about the central pole piece and co-axial therewith thereby defining an annular space therebetween, the lens further comprising an energizing means disposed in the annular space.

12. A magnetic lens as claimed in claim 1 wherein the central pole piece comprises a body, a moveable element being arranged for movement therein.

13. A magnetic lens as claimed in claim 12 wherein the body has a through-bore for accommodating therein the moveable element.

14. A magnetic lens as claimed in claim 12 wherein the moveable element is moveable between at least a first position and a second position with respect to the body of the central pole piece, wherein, in the first position, the moveable element is positioned with respect to the body whereby the first and second magnetic parts of the moveable element are in connection with the body such that the first and second magnetic parts form part of the central pole piece thereby defining a first focal length of the lens and, in the second position, the moveable element is positioned with respect to the body whereby the first magnetic part of the moveable element is in connection with the body such that the first magnetic part forms part of the central pole piece and the second magnetic part of the moveable element is in connection with the outer pole piece such that the second magnetic part forms part of the outer pole piece, thereby defining a second focal length of the lens.

15. A magnetic lens as claimed in claim 1 wherein the outer pole piece has a sample facing end which extends inward toward the central pole piece, wherein said end has an internal diameter which decreases in the direction of the sample.

16. A magnetic lens as claimed in claim 1 wherein, in the first position, the central pole piece does not extend out of the lens beyond the outer pole piece and, in the second position, the central pole piece extends out of the lens beyond the outer pole piece.

17. A magnetic lens as claimed in claim 1 wherein the outer pole piece comprises a magnetic moveable element which comprises a magnetic part which, in a first position, forms at least part of the outer pole piece whereby a first magnetic circuit is generated and, in a second position, forms part of the central pole piece whereby a second magnetic circuit is generated, different from the first magnetic circuit.

18. A magnetic lens as claimed in claim 1 wherein the lens provides at least two different magnifications.

19. A magnetic lens as claimed in claim 18 wherein the lens provides at least three different magnifications.

20. A method of focusing charged particles emitted from a sample comprising:
    providing a magnetic lens in proximity to the sample for generating a magnetic imaging field to focus the charged particles;
    energizing the magnetic lens to generate the magnetic imaging field;
    causing charged particles to be emitted from the sample; and
    focusing at least some of the charged particles emitted from the sample to produce a charged particle image of the sample;
    wherein the magnetic lens comprises a central pole piece and an outer pole piece disposed about the central pole piece, wherein the lens further comprises at least one magnetic moveable element for movement relative to at least one of the pole pieces, whereby a focal length of the lens is variable by said movement of the at least one magnetic moveable element.

21. A method as claimed in claim 20 comprising energizing the lens when at least one moveable element of the lens is in a first position thereby defining a first focal length of the lens and providing the lens in proximity to the sample at a first working distance and energizing the lens when the moveable element is in a second position thereby defining a second focal length of the lens and providing the lens in proximity to the sample at a second working distance.

22. The method of claim 20, wherein the step of causing charged particles to be emitted from the sample includes irradiating a surface region of the sample with radiation thereby causing the emission of charged particles from the surface region and further comprising a step of analyzing the energy of the focused charged particles.

23. An analyzer for analyzing a selected area of the surface region of a sample comprising: a sample holder for holding the sample; a source of radiation for causing the emission of charged particles from a sample placed on the sample holder;

a magnetic lens for focusing at least some of the charged particles emitted from the sample; and analyzing means for analyzing the energy of the focused charged particles emitted from the sample, wherein the magnetic lens comprises a central pole piece and an outer pole piece disposed about the central pole piece, wherein the lens comprises at least one magnetic moveable element for movement relative to at least one of the pole pieces, whereby a focal length of the lens is variable by said movement of the at least one magnetic moveable element.

24. The analyzer of claim 23, wherein the source of radiation includes a source of x-ray or ultraviolet radiation for causing the emission of photoelectrons from the sample, and wherein the analyzer means includes and electron analyzing means for analyzing the energy of the focused photoelectrons emitted from the sample.

* * * * *